US006023091A

United States Patent [19]

Koch et al.

[11] Patent Number: 6,023,091

[45] Date of Patent: Feb. 8, 2000

[54] SEMICONDUCTOR HEATER AND METHOD FOR MAKING

[75] Inventors: Daniel J. Koch, Mesa; Kenneth G. Goldman, Chandler; Keith G. Kamekona, Scottsdale; Mark D. Summers, Phoenix, all of Ariz.

[73] Assignee: Motorola, Inc., Schaumburg, Ill.

[21] Appl. No.: 08/565,735

[22] Filed: Nov. 30, 1995

[51] Int. Cl.[7] ........ H01L 29/00

[52] U.S. Cl. ........ 257/536; 257/537

[58] Field of Search ........ 257/536, 537, 257/522; 438/21, 421–422

[56] References Cited

U.S. PATENT DOCUMENTS

| | | | |
|---|---|---|---|
| 4,601,777 | 7/1986 | Hawkins et al. . | |
| 4,638,337 | 1/1987 | Torpey et al. . | |
| 4,639,748 | 1/1987 | Drake et al. . | |
| 4,967,589 | 11/1990 | Yagawara et al. | 73/23.25 |
| 5,169,806 | 12/1992 | Hawkins et al. . | |
| 5,285,131 | 2/1994 | Muller et al. . | |
| 5,345,213 | 9/1994 | Semancik et al. | 338/34 |
| 5,450,109 | 9/1995 | Hock | 347/67 |
| 5,510,645 | 4/1996 | Fitch et al. | 257/522 |

FOREIGN PATENT DOCUMENTS

| | | |
|---|---|---|
| 0313390 | 4/1989 | European Pat. Off. . |
| 0751389 | 1/1997 | European Pat. Off. . |
| 9410822 | 5/1994 | WIPO . |

OTHER PUBLICATIONS

C.H. Mastrangelo et al., "Microfabricated Incandescent Lamps", Applied Optics, vol. 30, No. 7, Mar. 1991, pp.868–873.

C.H. Mastrangelo et al., "Vacuum–sealed Silicon Micromachined Incandescent Light Source", IEEE, 1989, pp. 503–506.

R.E. Cavicchi et al., "Optimized Temperature Pulse Sequences for the Enhancement of Chemically–specific Response Patterns from Micro–Hotplate Gas Sensors", Transducers–Eurosensors IX, Sweden, Jun. 25–29, 1995, pp. 823–826.

*Primary Examiner*—Carl Whitehead, Jr.
*Assistant Examiner*—Roy Potter
*Attorney, Agent, or Firm*—Robert F. Hightower

[57] ABSTRACT

A sealable air gap (14) is formed between a heating element (16) and a base (11) to improve the thermal isolation of a semiconductor heater (10). A top layer (17) is formed over the heating element (16) which seals the air gap (14) so that the sealable air gap (14) can be at either atmospheric pressure or under a vacuum. The semiconductor heater (10) can be used in a variety of applications including as a heat source to adjust the resistivity of an overlying resistive layer (18). The embodiments of the semiconductor heater (10) also include a chemical sensor (20). Heat from a heating element (26) is used to keep an overlying layer of chemical sensing material (28) at an optimal temperature. The embodiments of the present invention also include a transducer (40) to heat a fluid (52) in a well (55) such as in an ink jet application.

23 Claims, 2 Drawing Sheets

SEMICONDUCTOR HEATER AND METHOD FOR MAKING

BACKGROUND OF THE INVENTION

This invention relates, in general, to semiconductor devices, and more particularly, to semiconductor devices used as heaters.

In some semiconductor applications, it is necessary to adjust the resistivity of a resistive element in a circuit to tune the response of the circuit to a particular application. One previously known method for adjusting the resistivity of a material, such as tungsten silicide, forms a heating element under the tungsten silicide. The heating element typically consists of a layer of polysilicon sandwiched between two insulators of silicon dioxide. A current is then passed through the layer of polysilicon which generates heat and anneals the tungsten silicide. The anneal modifies the stoichiometric properties of the tungsten silicide, which in turn reduces the resistivity of the tungsten silicide layer.

One problem with the above mentioned process is that the heating element not only heats the tungsten silicide layer, but everything within a large radius of the heating element. The thermal isolation of silicon dioxide layers or silicon substrates is poor at best. In order to anneal a tungsten silicide layer, temperatures of 500° C. to 1100° C. are required. Due to the thermal loss to the surrounding areas, this previously known heating element limits the composition of structures that can be built in close proximity to the heating element. Also, this method requires significant power consumption to heat both the tungsten silicide layer and the surrounding mass.

The high temperature requirements and thermal energy loss into surrounding areas restricts the placement in a process flow where the annealing process can take place. Most metal interconnect used in the semiconductor industry cannot be heated above 480° C. This limits the use of the heating element to the portion of the process flow that is prior to the deposition of any metal interconnect layers.

The thermal energy loss into surrounding areas also limits how far this technique can be scaled. The shrinking of this previously known heating element is limited by the thermal conductivity of the materials used to form the heater, instead of the photolithographic process used to pattern the previously known heating element. As a result, this process is generally not scaleable since device geometries are ever decreasing.

By now it should be appreciated that it would be advantageous to provide a heating element with improved thermal isolation from neighboring device structures. It would be of further advantage if the heating element requires less power to perform its desired function and is scaleable with decreasing device geometries. It would be of even further advantage if the heating element can be used in other applications such as chemical sensors and thermal ink jet printers.

DETAILED DESCRIPTION OF THE DRAWINGS

Figure 1:
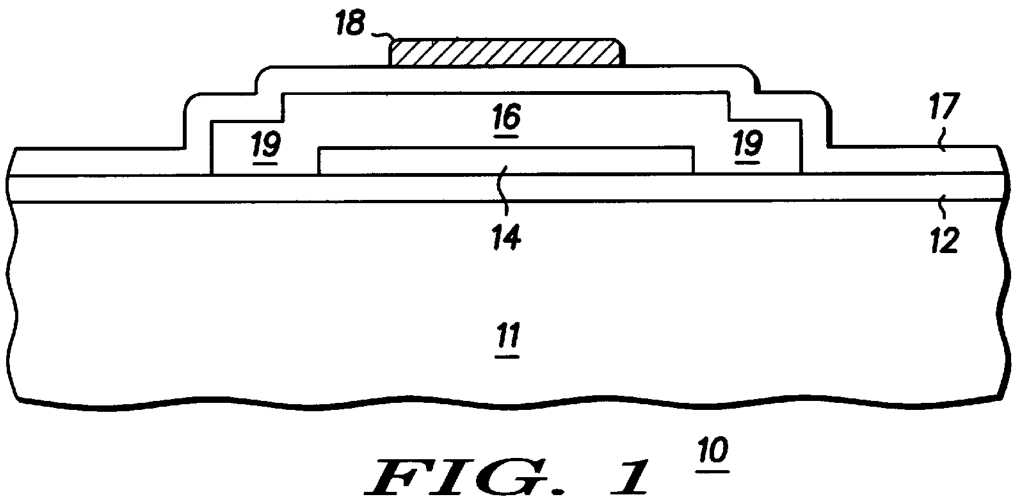
FIGS. 1–2 are enlarged cross-sectional views showing a heater according to the present invention at various stages of fabrication.

FIG. 1 is an enlarged cross-sectional view of a semiconductor device, heater, or semiconductor heater 10 according to the present invention. Semiconductor heater 10 is designed to provide heat to a fluid or material in contact with a top layer 17 while being essentially thermally isolated from a base 11 that semiconductor heater 10 is formed on. The thermal isolation in semiconductor heater 10 is provided by a sealable air gap 14 between a heating element 16 and base 11 or a layer of semiconductor material 12. The presence of semiconductor material 12 is optional as will be described shortly. Sealable air gap 14 can be formed such that sealable air gap 14 is under a vacuum of 1 mtorr to 760 torr. The vacuum pressure has the unexpected improvement of increasing the thermal insulation of semiconductor heater 10 by 500 percent over some previously known heaters.

In the past, traditional heaters have been formed by depositing a layer of polysilicon between two dielectric layers such as layers of silicon dioxide. The thermal isolation of these dielectric layers is poor, relative to air, so as the polysilicon layer is heated, the dielectric layers conduct the thermal energy into the area surrounding the heater. In some semiconductor applications, it is necessary for the heater to provide 500° C. to 1100° C. for a sustained period of time. Due to the thermal conduction into neighboring areas, it is possible for this heat to damage many of the structures used in the semiconductor industry. In the present invention, however, a sealable air gap 14 is formed to thermally isolate heating element 16 from any neighboring structures.

As described below in the process for making semiconductor heater 10, the present invention forms a sealable air gap 14 with fewer process steps than required with other previously known structures. Other previously known methods for forming a heater use a structure that is similar in design to an accelerometer. Typically, such heaters have a suspended heating element that may or may not be exposed to the ambient surrounding the heater. Such structures require a complicated sequence of deposition and etch steps in order to form the heating element so that it is properly suspended and supported. Because of the difficulty and the number of process steps, such heater structures are expensive to form.

Figure 2:
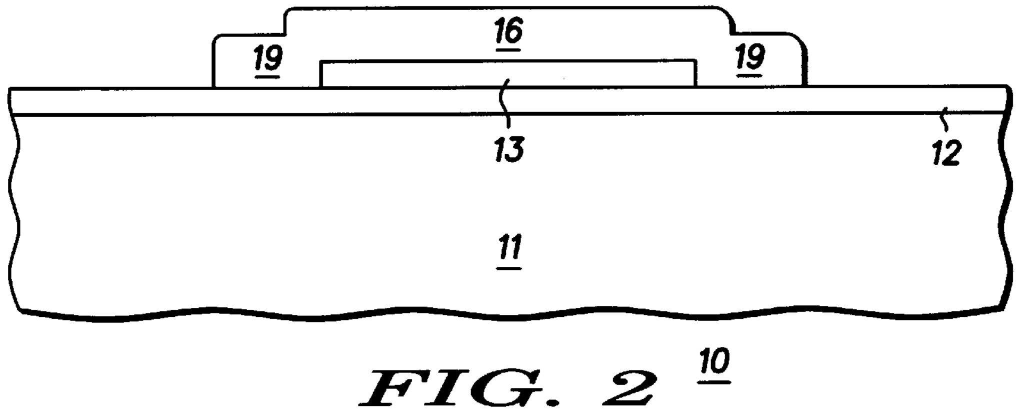

A method for forming semiconductor heater 10 will now be provided. FIG. 2 is an enlarged cross-sectional view of semiconductor heater 10 in the early stage of fabrication with the completed structure shown in FIG. 1. First a base 11 is provided, which is preferably a semiconductor substrate or an insulating substrate, but can be any material that can withstand the process conditions to follow. If base 11 is not resistant to the wet etch used to form sealable air gap 14, it may be necessary to form a layer of semiconductor material 12 overlying base 11. This sacrificial etch barrier layer 12 is typically 100Å to 10,000Å thick and is preferably formed from silicon nitride using either a low pressure chemical vapor deposition (LPCVD) or a plasma enhanced chemical vapor deposition (PECVD) process. A LPCVD process combines ammonia and dichlorosilane at 700° C. to 950° C., and a PECVD deposition can use the same reactants at 300° C. to 600° C.

A sacrificial layer 13, preferably phosphosilicate glass (PSG), is deposited using either a LPCVD reaction of tetraethylorthosilicate (TEOS) and phosphine at 300° C. to 800° C. or the PECVD reaction of the same chemicals at 250° C. to 500° C. Sacrificial layer 13 is typically 1,000Å to 50,000Å thick and doped to a dopant concentration of 1 percent to 12 percent to accelerate the future wet etch removal of sacrificial layer 13. It should be understood that sacrificial layer 13 can also be formed from undoped silicon dioxide or doped with other species such as boron or a combination of boron and phosphorus. Portions of sacrificial layer 13 are then exposed using a layer of photoresist with a typical thickness of 1 μm. The exposed portions of sacrificial layer 13 are then removed using a reactive ion etch (RIE) using a fluorine-based ion, or sacrificial layer 13 can be etched with a wet etch solution comprising hydrofluoric acid. The layer of photoresist is then removed using a wet etch of sulfuric acid and peroxide.

Heating element 16 is formed by depositing a 500Å to 50,0000Å thick layer of resistive material such as silicon, polysilicon, epitaxial silicon, amorphous silicon, or float-zone silicon onto the remaining portions of sacrificial layer 13 and sacrificial etch barrier layer 12. For example, a layer of silicon, polysilicon, or amorphous silicon can be formed using the decomposition of silane in either a LPCVD reaction at 500° C. to 800° C. or in a PECVD reaction at 300° C. to 500° C. The resistive material used to form heating element 16 is preferably in situ-doped using phosphine such that heating element 16 will have a resistance of about 10 ohms to 10 Mega ohms. It should also be understood that the resistive material can be doped after deposition with an anneal in a phosphine ambient. A second layer of photoresist is then patterned to expose portions of the resistive material. An RIE etch using a chlorine or fluorine based ion is then performed to define the portions of heating element 16. With this etch, anchor regions 19 are formed near the edges of sacrificial layer 13 to provide support to heating element 16 and any overlying layers.

Turning again to FIG. 1, after the second photoresist layer is removed, the remaining portions of sacrificial layer 13 are removed to form sealable air gap 14. A wet etch of a buffered solution of hydrofluoric acid will effectively remove sacrificial layer 13. Hydrofluoric acid has a high selectivity to sacrificial etch barrier layer 12 and heating element 16. An encapsulating top layer 17 is then formed over heating element 16 and sacrificial etch barrier layer 12 to seal air gap 14. Preferably, top layer 17 is a dielectric layer that is about 500Å to 75,000Å thick. Top layer 17 is formed from a material such as silicon nitride which is deposited using a low pressure and low temperature PECVD process. Since sealable air gap 14 is at the same low pressure conditions as the PECVD reaction chamber during deposition, it is possible to form a sealable air gap 14 that will remain under a vacuum when semiconductor heater 10 is formed.

To operate semiconductor heater 10, a current flow is passed through heating element 16. Heating element 16 is formed from a resistive material, so the energy from the current flow will be converted to thermal energy. Since heating element 16 is in physical contact with top layer 17, this thermal energy will conduct from the internal side of top layer 17 to the external side of top layer 17. An electrical connection (not shown) to heating element 16 is made at or near anchor regions 19 to minimize the thermal conduction into base 11.

Figure 3:
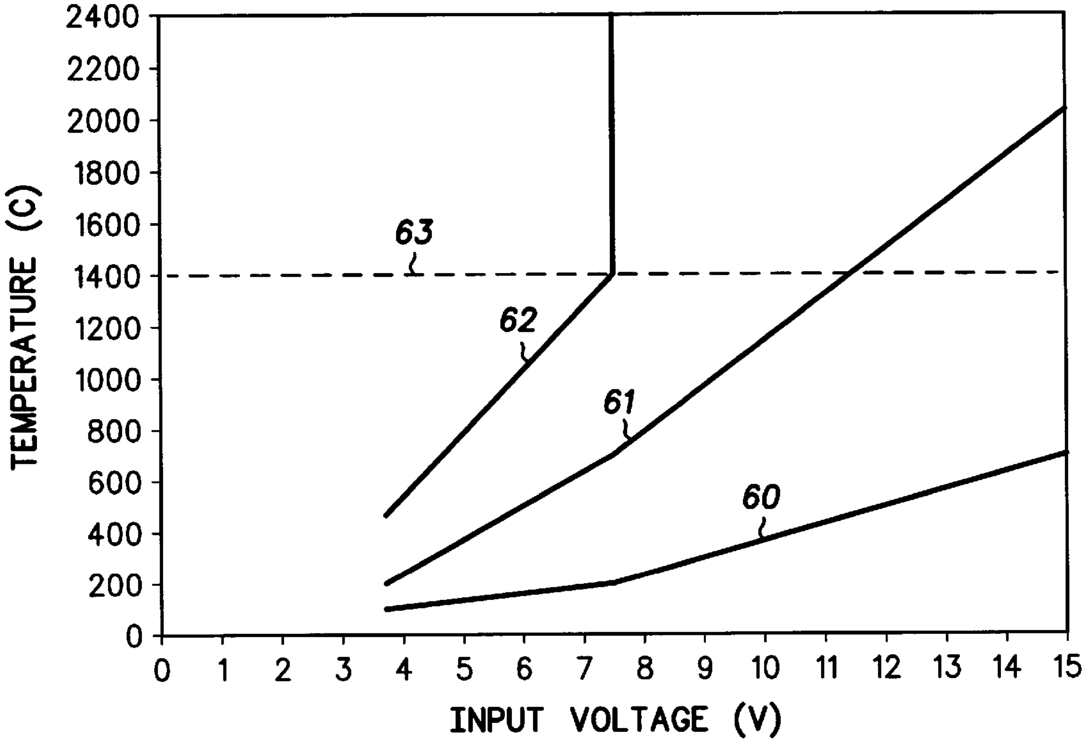
FIG. 3 is a graph comparing the temperature generated as a function of voltage for various heaters.

Turning now to FIG. 3, FIG. 3 is a graph of the temperature produced in degrees (Celsius) as a function of the voltage (volts) applied across heaters of various configurations. Line 60 represents the temperature achieved with a previously known heating element consisting of a polysilicon line sandwiched between two layers of silicon dioxide. Line 61 represents the performance of a semiconductor heater 10 that is formed according to the present invention except that the sealable air gap 14 is at normal atmospheric pressure. Line 62 represents the performance of semiconductor heater 10 according to the present invention with sealable air gap 14 under a vacuum pressure.

Line 63 indicates the melting point of silicon, and as shown in FIG. 3, it requires less energy to reach this temperature with semiconductor heater 10 with a vacuum air gap 14 then it does with a semiconductor heater with an air gap at atmospheric pressure or a previously known heater that does not have an air gap. At 7.5 volts, for example, semiconductor heater 10 of the present invention, will reach nearly 1400° C. At the same voltage, however, a heater with a sealable air gap 14 at atmospheric pressure will reach 625° C., and the previously known heater will only reach approximately 250° C. Comparing semiconductor heater 10 to a previously known heater there is over a 500 percent increase in the heating capability for the same amount of voltage used with each heater. Due to the thermal isolation and reduction in thermal loss, semiconductor heater 10 of the present invention is capable of generating much higher temperatures. Semiconductor heater 10 can also produce the same temperature as a previously known heater, but with a much lower voltage. This makes semiconductor heater 10 ideal for low voltage applications that require high temperatures. Considering Ohm's Law, a 50% reduction in the voltage, used by semiconductor heater 10 of the present invention, will reduce the power consumption of semiconductor heater 10 by 200%.

Semiconductor heater 10 can be used in a variety of applications depending on the fluid, gas, or material that semiconductor heater 10 comes in contact with or is formed overlying semiconductor heater 10. Referring now back to FIG. 1, a first application for semiconductor heater 10 will be provided. One particular use for semiconductor heater 10 is to provide an annealing temperature to adjust the resistivity of material that comes in contact with semiconductor heater 10 such as adjusting the resistivity of a resistor 18 formed on top layer 17. This feature can be used as part of the final assembly process so that the performance of a circuit can be adjusted by modifying the resistance of resistor 18. To form resistor 18, a second resistive material (not shown) is formed on top layer 17. Depending on the resistivity required, the second resistive material can be formed from a variety of materials such as tungsten silicide, titanium silicide, molybdenum silicide, chromium silicide, cobalt silicide, or tantalum silicide, which is either evaporated, sputtered, or deposited using LPCVD or PECVD. The second resistive material is then selectively patterned and etched to form resistor 18 with the desired dimensions.

The portion of resistor 18 that remains on top layer 17 is thermally coupled to heating element 16 by top layer 17. Therefore, when a current is directed through heating element 16, the resulting heat will anneal resistor 18 and adjust its resistivity. For example, if resistor 18 is formed from a layer of tungsten silicide, then the heat, 500° C. to 1100° C., from semiconductor heater 10 will change the stoichiometric property of the tungsten silicide. This in turn, will adjust the resistivity of the tungsten silicide and change the resistance of resistor 18. Since semiconductor heater 10 has minimal thermal loss to the neighboring circuit structures (not shown), it is possible to form semiconductor heater 10 in close proximity to other structures such as complementary metal oxide semiconductor (CMOS) devices.

In contrast, the previously known heater that consists of a polysilicon layer sandwiched between two layers of silicon dioxide, loses a tremendous amount of thermal energy to the underlying substrate. For instance, if this previously known heater were used to heat a layer of tungsten silicide to 800°

C., portions of the neighboring substrate that are 100 microns from this heater would be heated to 500° C. This temperature is sufficient to damage or melt any neighboring aluminum metal lines or other structures that are within this 100 micron radius.

Unlike prior heaters, the present invention has improved thermal isolation so that the heating of neighboring structures is minimized. Continuing with the above example, if a tungsten silicide layer on top layer 17 were heated to 800° C. with semiconductor heater 10, the portion of base 11 that is 100 microns from semiconductor heater 10 would only reach 100° C. Therefore, semiconductor heater 10 can be integrated into a CMOS process flow and then perform the anneal step even after aluminum metal interconnect lines are formed because there is minimal risk of damaging neighboring structures. The thermal isolation of semiconductor heater 10 also allows the present invention to be scaled to smaller device geometries since semiconductor heater 10 does not limit the proximity of neighboring structures like the above mentioned, previously known heater.

Figure 4:
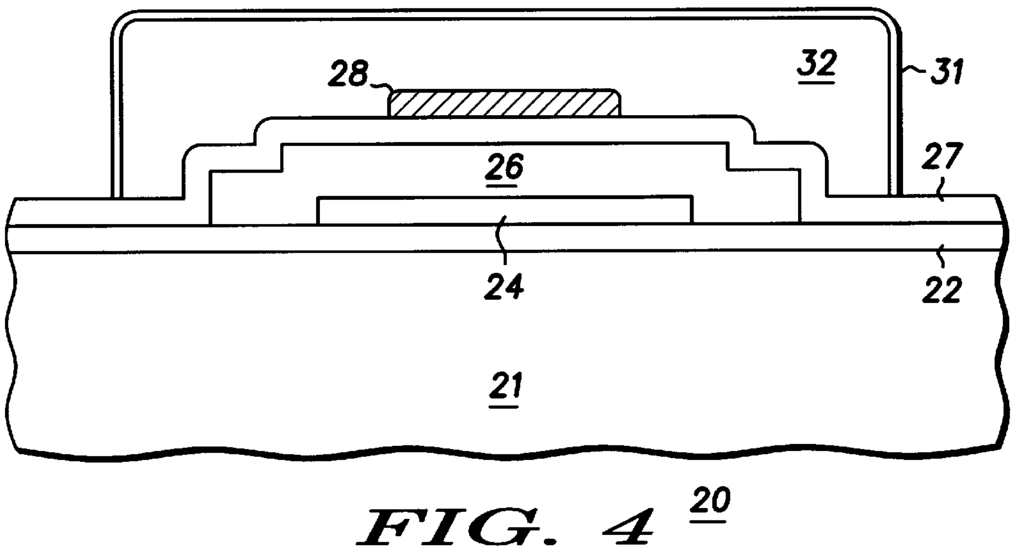
FIG. 4 is an enlarged cross-sectional view showing a heater used as part of a chemical sensor according to a second embodiment of the present invention.

Turning now to FIG. 4, a second application for the semiconductor heater of the present invention will be provided. Semiconductor heater 10 can also be used, in part, to form a chemical sensor 20 to detect the presence of a chemical in an ambient 32. Chemical sensor 20 comprises a sealable air gap 24 that thermally isolates a heating element 26 from a base 21. A sacrificial etch barrier layer 22 may be formed on base 21 in order to protect base 21 during the fabrication process of chemical sensor 20. A top layer 27 is formed over heating element 26 which seals air gap 24.

A chemically sensitive material 28 is then formed on top layer 27 by a CVD, PECVD, sputtering, or evaporating process. The material can then be selectively patterned using a layer of photoresist and the appropriate etchant. Chemically sensitive material 28 has the property that when it comes in contact with a particular chemical, chemically sensitive material 28 changes its resistivity. Some materials, which have this chemical sensing property, include tin oxide, iron oxide, tungsten oxide, nickel oxide, zinc oxide, cobalt oxide, indium oxide, niobium oxide, and the compound $LaCrO_3$. Some of these materials, however, only have this chemical sensing feature if the material is at the proper temperature. This makes the embodiments of the present invention ideal for applications that sense the presence of certain chemicals.

For example, if chemically sensitive material 28 is formed using the CVD deposition of tin oxide, chemical sensor 20 can be used to detect the presence of carbon monoxide. Heating element 26 is used to heat layer of chemically sensitive material 28 to a temperature of 95° C. to 800° C. If just trace amounts of carbon monoxide should enter ambient 32, then a portion of the tin oxide will react with the carbon monoxide. This in turn, will change the resistivity of chemically sensitive material 28 to indicate the presence of carbon monoxide. Ambient 32 is defined by a lid 31 which is permeable and allows the chemical, to be sensed by chemical sensor 20, to pass through lid 31. Since chemical sensor 20 is capable of heating chemically sensitive material 28 with minimal thermal loss to base 21, the present invention provides a chemical sensor 20 that consumes less power than some previously known chemical sensors.

Figure 5:
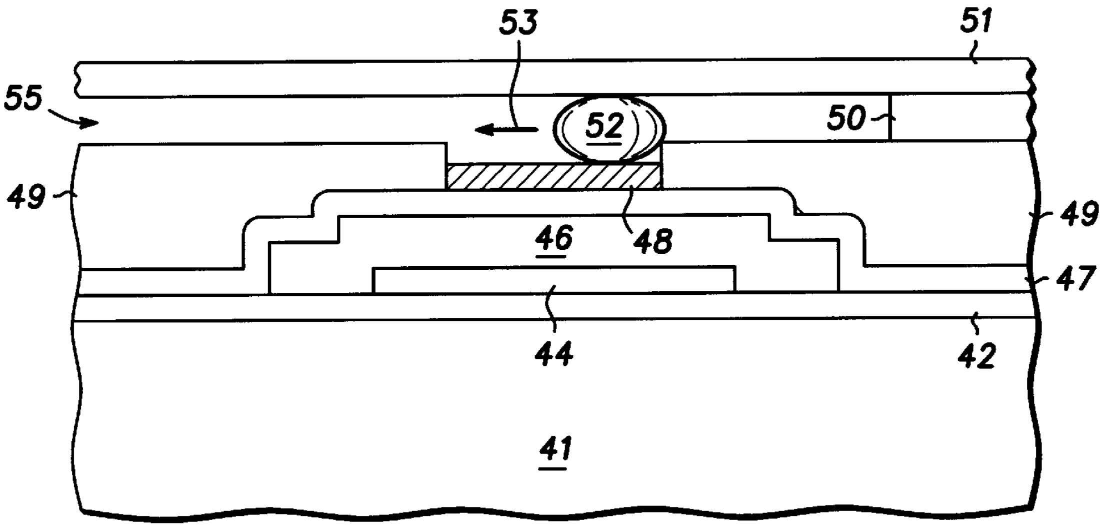
FIG. 5 is an enlarged cross-sectional view showing a heater used as part of a ink jet print head according to a third embodiment of the present invention.

Turning now to FIG. 5, a third application for the semiconductor heater of the present invention will be provided. Using the same process described above to form semiconductor heater 10, it is possible to form a transducer 40. Transducer 40 comprises portions of semiconductor heater 10 of FIG. 1 that are coupled to a well 55 of a fluid 52 such that a heating element 46 is used to heat fluid 52. Transducer 40 is formed so that heating element 46 is thermally isolated from a base 41 by a sealable air gap 44. A sacrificial etch barrier layer 42 may be formed on base 41 in order to protect base 41 during the fabrication process of transducer 40. A top layer 47 is formed over heating element 46 which seals air gap 44.

A bonding layer 49 comprising polyimide or phosphosilicate glass is then formed on top layer 47. Bonding layer 49 is then selectively patterned and etched to expose portions of top layer 47. To protect top layer 47 and any other components of the heater, a layer of barrier material 48 is then sputtered, CVD deposited, PECVD deposited, or evaporated onto bonding layer 49 and the exposed portions of top layer 47. Layer of barrier material 48 can comprise any protective material such as palladium or tantalum. Layer of barrier material 48 is then selectively patterned and etched so that only the portion on the exposed top layer 47 remains. It should also be understood that bonding layer 49 and layer of barrier material 48 can be disposed in reverse order. Well 55 is then formed by bonding a silicon substrate 51 to bonding layer 49 at bonding region 50 using techniques commonly known in the art. Such techniques are described in U.S. Pat. No. 4,601,777 which issued to Hawkins et al. on Jul. 22, 1986 and is hereby incorporated by reference.

Heat generated by heating element 46 causes a localized boiling of fluid 52. The localized boiling causes a nucleation vapor pressure in well 55 which forces a portion of fluid 52 to be ejected from well 55 through an opening in the direction shown by arrow 53. It should be understood that fluid 52 can be thermal ink, photoreprographic ink, medicine, fuel, or the like. Therefore, transducer 40 has a variety of applications for dispensing fluid such as in ink jet printers, photocopiers, or the distribution of medication in medical systems. Since transducer 40 is capable of heating a fluid with minimal thermal loss to base 41, the present invention provides a transducer 40 that consumes less power than some previously known transducers.

By now it should be appreciated that the present invention provides for a semiconductor heater 10 which has improved thermal isolation to the base 11 that it is formed on. The thermal isolation is provided by a sealable air gap 14 between heating element 16 and base 11. Since the present invention improves the thermal isolation by as much as 500 percent versus previously known heaters, semiconductor heater 10 consumes less power which allows it to be used in a variety of applications which would not be feasible with other heaters. The improvement in thermal isolation also improves the packing density of a semiconductor circuit that employs semiconductor heater 10 since thermally sensitive structures can be formed in closer proximity to semiconductor heater 10. The present invention also requires fewer processing steps to fabricate than some previously known heaters. This, in combination with the improvement in packing density, reduces the total manufacturing cost of applications incorporating semiconductor heater 10.

We claim:

1. A semiconductor device comprising:

a first layer of semiconductor material;

a resistive layer of semiconductor material overlying the first layer of semiconductor material, wherein a sealable air gap is present between the first layer of semiconductor material and the resistive layer of semiconductor material, the resistive layer of semiconductor material being thermally isolated from the first layer of semiconductor material by the sealable air gap; and a dielectric layer overlying the first layer of semiconductor material and at least a portion of the dielectric layer is contiguous with at least a portion of the resistive layer of semiconductor material.

2. The semiconductor device of claim 1 wherein the sealable air gap is under a pressure.

3. The semiconductor device of claim 2 wherein the pressure is a vacuum pressure of 1 mtorr to 760 torr.

4. The semiconductor device of claim 1 wherein the resistive layer of semiconductor material is selected from the group consisting of polysilicon, amorphous silicon, epitaxial silicon, and float zone silicon.

5. The semiconductor device of claim 1 wherein the dielectric layer has an exterior surface and an interior surface, and the resistive layer of semiconductor material extends from the interior surface of the dielectric layer.

6. The semiconductor device of claim 1 wherein the resistive layer of semiconductor material is doped to a resistance of about 10 ohms to 10 Mega ohms.

7. The semiconductor device of claim 1 wherein the first layer of semiconductor material is selected from the group consisting of silicon, polysilicon, an insulating substrate, silicon nitride, and silicon dioxide.

8. The semiconductor device of claim 1 further comprising a layer of chemically sensitive material on an exterior surface of the dielectric layer.

9. The semiconductor device of claim 8 wherein the layer of chemically sensitive material is selected from the group consisting of tin oxide, iron oxide, tungsten oxide, nickel oxide, zinc oxide, cobalt oxide, indium oxide, niobium oxide, and the compound $LaCrO_3$.

10. The semiconductor device of claim 1 further comprising a well of a fluid on an exterior surface of the dielectric layer.

11. The semiconductor device of claim 10 wherein the fluid is selected from the group consisting of photoreprographic ink, thermal ink, medicine and fuel.

12. A semiconductor device formed on a base comprising:

a heating element overlying the base such that an air gap is present between the heating element and the base; and a top layer overlying the base such that the heating element is thermally coupled to the top layer, wherein the heating element is thermally isolated from the base by the air gap.

13. The semiconductor device of claim 12 wherein the air gap is under a pressure.

14. The semiconductor device of claim 13 wherein the pressure is a vacuum pressure of about 1 mtorr to 760 torr.

15. The semiconductor device of claim 12 wherein the heating element is selected from the group consisting of polysilicon, amorphous silicon, epitaxial silicon, and float zone silicon.

16. The semiconductor device of claim 12 further comprising a layer of chemically sensitive material on an exterior surface of the top layer.

17. The semiconductor device of claim 16 wherein the layer of chemically sensitive material is selected from the group consisting of tin oxide, iron oxide, tungsten oxide, nickel oxide, zinc oxide, cobalt oxide, indium oxide, niobium oxide, and the compound $LaCrO_3$.

18. The semiconductor device of claim 12 further comprising a well of a fluid on an exterior surface of the top layer.

19. The semiconductor device of claim 18 wherein the fluid is selected from the group consisting of photoreprographic ink, medicine, thermal ink, and fuel.

20. An apparatus comprising:

a layer of semiconductor material;

a heating element overlying the layer of semiconductor material;

a sealable air gap between the heating element and the layer of semiconductor material; and a first layer of material overlying the heating element and thermally coupled to the heating element.

21. The apparatus of claim 20 wherein the first layer of material comprises a dielectric material that is thermally coupled to the heating element.

22. The apparatus of claim 21 wherein the first layer of material is thermally isolated from the layer of semiconductor material by the sealable air gap.

23. A method for forming a semiconductor device comprising the steps of:

providing a base having a surface;

forming a sacrificial layer on the surface of the base;

forming a layer of resistive material overlying the sacrificial layer;

forming a top layer overlying the layer of resistive material; and removing at least a portion of the sacrificial layer to form an air gap so that the layer of resistive material is thermally isolated from the base by the air gap, wherein a portion of the top layer seals at least a portion of the air gap.

* * * * *